United States Patent
Buijsman et al.

(10) Patent No.: US 6,861,731 B2
(45) Date of Patent: Mar. 1, 2005

(54) MODULE AND ELECTRONIC DEVICE

(75) Inventors: Adrianus Alphonsus Jozef Buijsman, Nijmegen (NL); Johannes Maria Cornelis Verspeek, Nijmegen (NL); Antonius Johannes Matheus de Graauw, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/085,669

(22) Filed: Feb. 27, 2002

(65) Prior Publication Data

US 2002/0167060 A1 Nov. 14, 2002

(30) Foreign Application Priority Data

Mar. 2, 2001 (EP) .............................. 01200794

(51) Int. Cl.⁷ ........................ H01L 23/82; H01L 23/28
(52) U.S. Cl. .................. 257/664; 257/728; 257/659; 257/796
(58) Field of Search ................. 257/664, 728, 257/659, 796, 730, 678, 679, 680, 681, 687, 688, 689, 693, 422, 421, 425, 428; 361/818, 752, 800, 302; 333/247, 260

(56) References Cited

U.S. PATENT DOCUMENTS

| | | | |
|---|---|---|---|
| 5,166,772 A | * | 11/1992 | Soldner et al. .............. 257/659 |
| 6,064,286 A | * | 5/2000 | Ziegner et al. ............. 257/728 |
| 6,118,672 A | * | 9/2000 | Yamauchi et al. .......... 361/818 |
| 6,236,366 B1 | * | 5/2001 | Yamamoto et al. .. 343/700 MS |
| 6,356,173 B1 | * | 3/2002 | Nagata et al. .............. 333/247 |
| 6,373,711 B2 | * | 4/2002 | Yamauchi et al. ............ 334/85 |
| 6,472,598 B1 | * | 10/2002 | Glenn ........................ 174/52.2 |
| 6,689,649 B2 | * | 2/2004 | Dennison et al. ........... 438/157 |

FOREIGN PATENT DOCUMENTS

| | | | |
|---|---|---|---|
| EP | 0766410 A2 | 4/1997 | ............ H04B/1/38 |
| JP | 09237867 | 9/1997 | ........... H01L/25/00 |
| JP | 10079623 A | 3/1998 | .......... H01Q/23/00 |
| WO | WO0048266 | 8/2000 | ............ H01Q/1/38 |

* cited by examiner

Primary Examiner—Carl Whitehead, Jr.
Assistant Examiner—Laura M Schillinger
(74) Attorney, Agent, or Firm—Peter Zawilski

(57) ABSTRACT

A radio module (10) suitable for RF applications, especially for Bluetooth, comprises a substrate (1) with a semiconductor device (11), a shield (21), and an antenna (31). The shield (21) is located between the antenna (31) and the semiconductor device (11), and is present on the same side (2) of the substrate (1) as the semiconductor device (11) and the antenna (31). By preference, the antenna (31) and the shield (21) are connected to one another by support means (32, 42).

12 Claims, 2 Drawing Sheets

MODULE AND ELECTRONIC DEVICE

The invention relates to a module comprising a substrate with a side, a semiconductor device, a shield of an electrically conducting material, and an antenna, said shield being present between the antenna and the semiconductor device.

The invention also relates to an electronic device.

Such a module is known from JP-A 9-237867. In the known module, the semiconductor device is present at a first side, and the antenna is present at a second, opposite side of the substrate. The shield is integrated in the substrate, which is constructed as a multilayer. This shield consists of two layers which are interconnected by a via and which each extend over part of the first side. The module can be placed with its first side on a carrier, such as a printed circuit board, for which purpose the semiconductor device is accommodated in a cavity. The module is suitable for high-frequency applications. Such a module is also applicable as a radio module which complies with the Bluetooth standard. In that case the semiconductor device is a transceiver, and the module comprises further passive components for decoupling and for the filtering of signals. These components are integrated in the substrate. Examples of electronic devices in which such a module is used are inter alia mobile telephones and computers.

It is a disadvantage of the known module that its design cannot be readily adapted, because a large number of, or indeed all passive components are integrated in the substrate.

It is an object of the invention to provide a module of the kind mentioned in the opening paragraph whose design can be adapted in a simple manner.

This object is achieved in that the shield and the antenna are present substantially at the same side of the substrate as is the semiconductor device. The invention is based on the recognition that the shield may be used as a base surface of the antenna which is connected to ground. As a result, substantially no or only one mechanical support is necessary for the antenna, and the antenna may be constructed as a single plate or layer of electrically conducting material.

The semiconductor device and further necessary components are present at the first side of the substrate in the module according to the invention. The substrate may be placed with its second side on a carrier, such as a printed circuit board. The shield and the antenna were placed in that order over the semiconductor device. Preferably, the shield and the antenna are at a mutual distance of 1 to 5 mm, more preferably at a mutual distance of approximately 2 mm. It may be that the shield and the antenna are electrically interconnected, but this is not necessarily the case. Now if an adaptation of the design of the module is desired, the substrate with the components present thereon or the antenna may be modified. An adaptation of the design may be, for example, that passive components are added, or that the dimensions of the module are changed. If an antenna is not desired in the design, it may be very easily left out.

The antenna and the shield may each be constructed as a metal plate, or alternatively as a gauze or as layers present on a carrier. The antenna and the shield may be fastened to the substrate independently of one another by means of projecting strips or teeth.

It is an advantage of the module according to the invention that it may have a substrate of small surface area. The shield and the antenna in fact occupy no or hardly any space on the substrate. In addition, components may be placed on the entire surface of the substrate. This is in contrast to the module of the prior art, in which components can only be placed in the cavity. The remaining portion of the surface of the substrate is opposite the carrier, where it is provided with ball grid arrays or some other connecting elements. A reduction of the substrate surface area down to the size of the antenna can be realized in the module according to the invention, for example in that some components are integrated in the substrate.

In a favorable embodiment, the shield is connected to the antenna by a support means. The advantage of a support means is that the shield can be constructed as a closed layer which together with the substrate entirely envelops the semiconductor device.

The support means forms an integral whole together with the antenna and the shield, ensuring a mechanical stability at least under operation conditions. The antenna and the shield remain in a mutually substantially parallel orientation during use of the module. Neither will there be any appreciable shifting of the antenna with respect to the shield. In addition, the entire construction of the shield, support means, and antenna can be assembled as one whole. This assembly may be fastened to the first side of the substrate as well as to the second side thereof. The assembly may furthermore be fastened to the carrier on which the module is to be placed.

The module according to the invention may be constructed in various ways, in particular as regards the construction of the assembly formed by the shield, the support means, and the antenna. In a first embodiment, the stability of said assembly is obtained in that the shield and the antenna are formed from bent metal plates. Each of these plates is itself fastened to the first or the second side of the substrate. The support means in this embodiment ensures that the shield and the antenna retain mutually substantially parallel orientations, and preferably remain at the same distance from one another during resonance. The support means need not extend over the entire shield and antenna. This has the advantage that the antenna and the shield are exposed to the air, so that heat can be easily removed. In addition, the cost of manufacture is very low in this case.

The support means is preferably a strip having a first end and a second end, which strip is undetachably connected at its first end to the metal plate of the antenna and is fastened at its second end to the shield. In particular, this strip is formed as a portion of the metal plate of the antenna, which portion was cut loose along three edges and bent. The strip may be connected to the shield, for example, by means of an electrically conducting glue or by mechanical means. Since the shield is connected to ground, the strip at the same time provides a connection from the antenna to ground. It is an advantage of this construction that no additional components need be provided in the manufacture of the module.

Alternatively, the support means may be manufactured from a rubbery material. Such materials are known to those skilled in the art and are commercially available. The support means is, for example, annular in shape and is clamped in between the shield and the antenna. No adhesion is required as a result of this. The support means of a rubbery material essentially serves as a shock absorber.

In a second embodiment of the stable construction of the module according to the invention, the support means is the carrier of the antenna and comprises the electrically insulating material. The shield is a metal plate which comprises a first, a second, and a third portion, said second portion adjoining the first and the third portion and being oriented substantially parallel to the substrate, while at least one of said first and third portions is connected with electrical conduction to electrical conductors at one of the sides of the substrate. The support means is fastened on the shield. The stability of the construction is achieved by the metal plate of the shield in this embodiment. Preferably, this metal plate has the shape of a cap. A fourth and a fifth portion on at two opposed sides will then in addition be present at the second portion. The first, third, fourth, and fifth portions are then all joined to the first side of the substrate. A material with a suitable dielectric constant is chosen for the support means, as known to those skilled in the art of antennas. Preferably, an adhesion-promoting layer is present between the support means and the shield. Furthermore, the support means may be an injection-molded product which substantially envelops the shield; such injection-molded products are known per se, for example as molded interconnects and as multilayer, flexible printed circuit boards. This injection-molded product may also envelop the antenna and at the same time serve as the package of the module.

It is an advantage of this embodiment that the antenna can be mainly localized at a lateral side of the module. In that case the antenna is oriented at an angle of approximately 60 to 120° with respect to the substrate, preferably at an angle of approximately 90°. Such an arrangement of the antenna may be favorable, for example, for the range thereof, or for preventing radiation in a certain direction. In addition, it offers a greater freedom of design for the electronic device.

In a third embodiment of the stable construction of the module according to the invention, the support means is the carrier of the antenna and of the shield. In this embodiment, the antenna and the shield may be constructed as layers provided, for example, by means of a printing technique on either side of the support means. The support means is preferably constructed from a hard, brittle material. Examples are ceramic materials in various forms and glass-type or polycrystalline polymeric materials. If the stable construction is positioned at the first side of the substrate, and the support means extends up to the substrate, having the shape of a cap, the support means together with the substrate will form a housing for the module.

The invention also relates to an electronic device provided with a module having an antenna and a semiconductor device, in particular a module suitable for transmitting and receiving in accordance with the Bluetooth protocol. A problem of such devices, such as laptop computers and mobile telephones, is that only little space is available therein. The result of this is that a module is to be adapted to specifications drawn up by a manufacturer of the electronic device. The use of the module according to the invention in the electronic device renders it possible for the module to be adapted to the device in a simple manner. Integration of the module in the device is accordingly possible, whereas a completely different solution would have to be chosen without the module according to the invention, for example in the form of a module suitable for processing signals received in accordance with the Bluetooth protocol and a separate antenna.

It is an advantage of the module according to the invention that the antenna projects above components in the device outside the module. In a preferred embodiment, the module has a height of 3 to 5 mm with respect to the printed circuit board. Other components in the device, such as power amplifiers for GSM or UMTS applications, microprocessors, filters, etc., usually have a height of 1 to 2 mm with respect to the printed circuit board. These components and the module are situated close together, in particular because only a limited space is available in the electronic device according to the invention. If the antenna projects above such components, less interference will occur. There will accordingly be less noise caused by the antenna. In an alternative embodiment, less or less intensive filtering of the antenna signal is necessary for a signal-to-noise ratio in an antenna signal to remain the same. The projecting position of the antenna is rendered possible by the module according to the invention, in which the antenna is placed above the substrate, the semiconductor device, and the shield.

These and other aspects of the module according to the invention will be explained in more detail with reference to drawings, in which.

Identical components in the various Figures have been given the same reference numerals.

Figure 1:
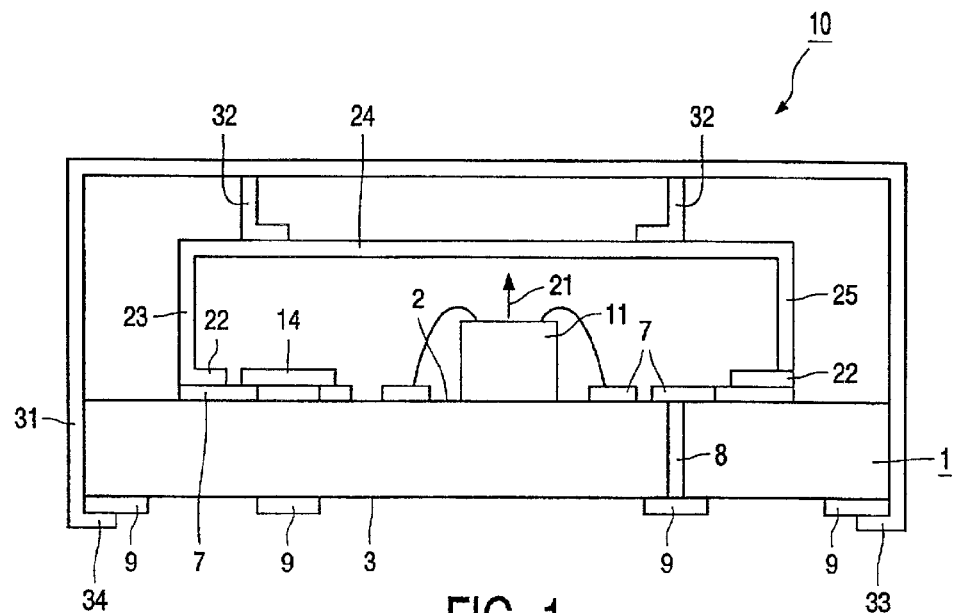
FIG. 1 is a diagrammatic cross-sectional view of a first embodiment of the module.

FIG. 1 shows the module 10 according to the invention which is provided with a substrate 1 having a first side 2 and a second side 3. A semiconductor device 11, an integrated circuit in this case serving as a transceiver, is present at the first side 2. Passive components 14, 15 serving for decoupling and filtering are also present at the first side 2. At the second side 3 of the substrate 1 there are means by which the module can be placed on a printed circuit board, for example electrically conducting contact pads 9 to which ball grids of a ball grid array can be fastened. The substrate 1 is provided with vias 8 which provide electrically conducting connections from the first side 2 to the second side 3 of the substrate. The substrate 1 is provided with electrical conductors 7 at its first side 2. The substrate 1 is manufactured from a ceramic material, but this is not essential. A laminate might equally well be used. Furthermore, the substrate may comprise electrodes and may be of the so-called Low Temperature Cofiring Ceramic (LTCC) type.

A shield 21 is fastened to the first side 2 of the substrate by means of strips 22. These strips 22 are glued or alternatively soldered to the electrical conductors 7. The shield is connected to ground through the electrical conductors 7 and the vias 8. The shield 21 is made of metal and comprises a first portion 23, a second portion 24, and a third portion 25. Not shown are fourth and fifth portions. The second portion 24 is oriented substantially parallel to the substrate 1. The first, third, fourth, and fifth portions all adjoin the second portion 24 and are provided with strips 22. The shield 21 thus has the shape of a cap.

An antenna 31 is also fastened to the first side 2 of the substrate 1. The antenna 31 is of the patch type and consists substantially of a metal plate. A strip 32 of the metal plate is cut out from the antenna 31 and is connected to the shield 21. This strip serves as a support means. The antenna 31 is further provided with an input terminal 33 by which the antenna is connected to the semiconductor device 11. The input terminal 33 at the same time provides mechanical stability. The antenna 31 is further provided with a second terminal 34. This terminal 34 may in principle be connected to ground. It is alternatively possible for this terminal to be connected to passive components by means of which the antenna 31 can be tuned. Such a tuning mechanism is described in the application (not previously published) no. EP 01200502.1 (PHNL010092). It is furthermore possible that a resonant circuit is connected to the second terminal 34, by means of which the frequency spectrum of the antenna 31 is widened. The specific connections from the terminals 33 and 34 to the semiconductor device 11 and to other devices are not shown in FIG. 1.

Figure 2:
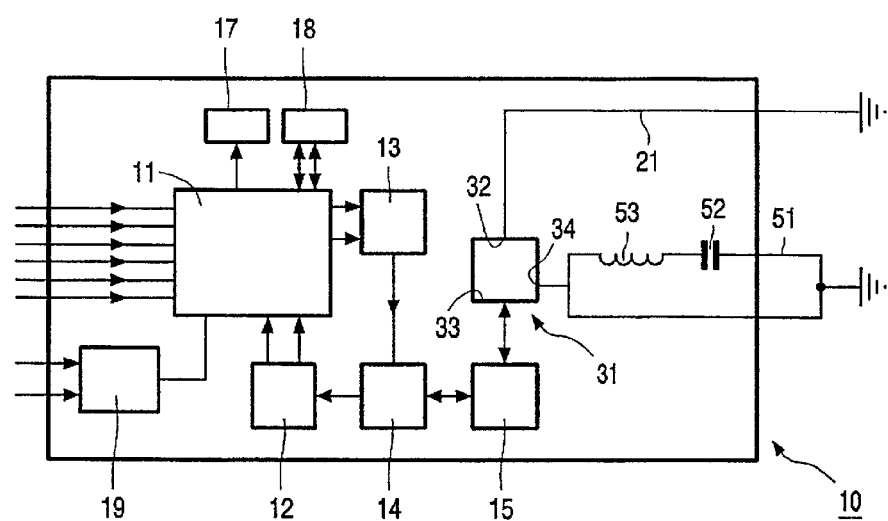
FIG. 2 is a block diagram of the first embodiment of the module.

FIG. 2 is a block diagram of the module 10. The semiconductor device 11 is provided with six inputs 19 and acts as a transceiver. Coupled to the semiconductor device 11 are a VCO tank 16, a PLL loop filter 17, and a supply decoupling unit 18. The transceiver 11 is capable of sending signals to the antenna 31 and receiving signals from the antenna 31. A TX/RX switch 14 is present for switching from the receiver to the transmitter function and vice versa. This TX/RX switch directs signals via the RX balun filter 12 to the semiconductor device 11. The signals transmitted by the semiconductor device 11 pass through the TX balun filter 13, the TX/RX switch 14, and a bandpass filter 15 to the antenna 31. The antenna is for this purpose provided with an input terminal 33. The antenna is further provided with a strip 32 serving as a ground terminal and connected to the shield 21 (not shown in FIG. 2), which in its turn is connected to ground. The antenna 31 is connected by its second terminal 34 to a resonant circuit 51 which comprises a capacitor 52 and an inductor 53. Preferably, the resonant circuit 51 is integrated in the substrate 1.

Figure 3:
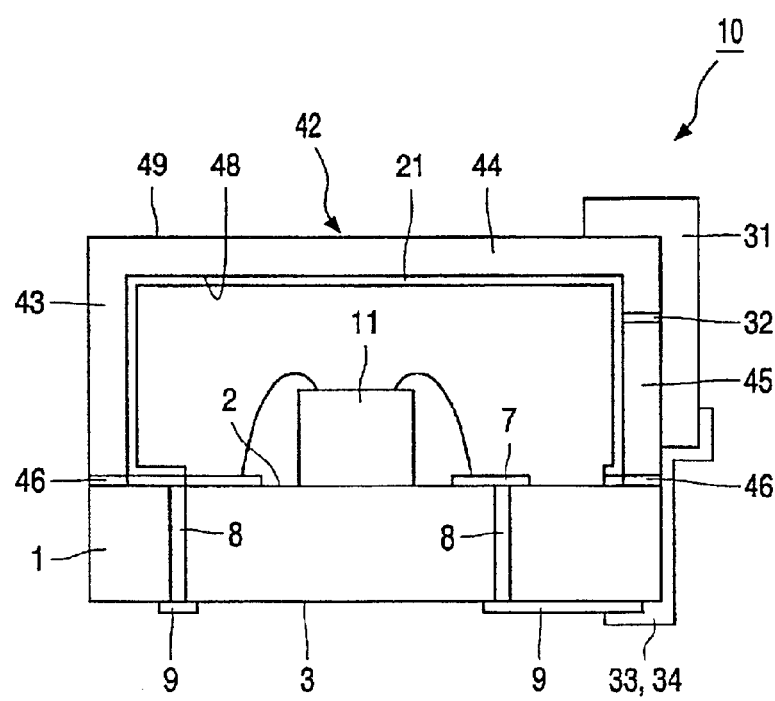
FIG. 3 is a diagrammatic cross-sectional view of a second embodiment of the module.

FIG. 3 shows a second embodiment of the module 10. The support means 42 in this embodiment is a carrier consisting of a laminate. The support means 42 comprises a first portion 43, a second portion 44, and a third portion 45. The support means 42 is manufactured, for example, through injection into a mold. It is alternatively possible that it was bent so as to form the first, second, and third portions 43, 44, 45 after the antenna 31 and the shield 21 had been provided. The support means 42 is fastened to the first side 2 of the substrate 1 by fastening means 46, glue in this case. Alternatively, for example, a mechanical fastening system such as a clip system or a rail system may be used. Strips 22 are fastened to the shield 21 and strips 33, 34 to the antenna 31 for a further improvement in the mechanical stability. The strips 33, 34 are adhered to the second side 3 of the substrate 1. A via 38 in the support means 42 serves as the ground terminal. The support means 42 has an inner side 48 and an outer side 49. The support means 42 is provided at its inner side 48 with a non-patterned layer, the shield 21, which is preferably made of copper. At its outer side 49, the support means 42 is provided with a patterned layer, the antenna 31, also preferably made of copper. The layer 31 may be provided and patterned in a known manner. The antenna 31 lies for the major part on the third portion 45 of the support means, whereby the range of the antenna 31 is directed.

What is claimed is:

1. A module comprising:
   a substrate with a side,
   a semiconductor device,
   a shield of an electrically conducting material, and
   an antenna mounted on the substrate, said shield being present between the antenna and the semiconductor device,
   wherein the shield and the antenna are present substantially at the same side of the substrate as the semiconductor device, wherein the shield is connected to the antenna by a support, and wherein the support is a strip having a first end and a second end, which strip is undetachably connected at its first end to the metal plate of the antenna and is fastened at its second end to the shield.

2. A module as claimed in claim 1, wherein the shield and the antenna are metal plates which each comprise a first, a second, and a third portion, said second portion adjoining the first and the third portion and being oriented substantially parallel to the substrate, while at least one of said first and third portions is connected with electrical conduction to electrical conductors at one of the sides of the substrate.

3. A module as claimed in claim 2, wherein the support comprises a rubbery, electrically insulating material.

4. A module as claimed in claim 2, wherein the third portion of the antenna is provided with teeth which are connected to the electrical conductor at one of the sides of the substrate.

5. A module comprising:
   a substrate with a side,
   a semiconductor device,
   a shield of an electrically conducting material, and
   an antenna mounted on the substrate, said shield being present between the antenna and the semiconductor device.
   wherein the shield and the antenna are present substantially at the same side of the substrate as the semiconductor device, wherein the shield is connected to the antenna to the antenna by a support wherein the support is the carder of the antenna and comprises an electrically insulating material, the shield is a metal plate which comprises a first, a second, and a third portion, said second portion adjoining the first and the third portion and being oriented substantially parallel to the substrate, while at least one of said first and third portions are connected with electrical conduction to electrical conductors at one of the sides of the substrate, and the support is fastened on the shield.

6. A module comprising:
   a substrata with a side,
   a semiconductor device,
   a shield of an electrically conducting material, and
   an antenna mounted on the substrate, said shield being present between the antenna and the semiconductor device,
   wherein the shield and the antenna are present substantially at the same side of the substrate an the semiconductor device, wherein the shield is connected to the antenna to the antenna by a support and wherein the support is the carrier of the antenna and of the shield.

7. A module as claimed in claim 6, wherein the support comprises a first, a second, and a third portion, said second portion adjoining the first and the third portion and being oriented so as to be substantially parallel to the substrate, while said first and third portions extend up to the substrate.

8. The module of claim 1, wherein a carrier is present on which the module and at least one component are fastened, which component emits radiation during operation of the device, the module arid the component each having a height with respect to the carrier such that the height of the module is greater than the height of the component.

9. The module of claim 1, wherein at least a portion of the shield and of the antenna are exposed to air so as to provide for the removal of heat from the module.

10. The module of claim 1, Wherein the support is Connected by an electrically conductive glue.

11. The module of claim 5, wherein at least a portion of the shield and of the antenna are exposed to air so as to provide for the removal of heat from the module.

12. The module of claim 6, at least a portion of the shield and of the antenna are exposed to air so as to provide for the removal of heat from the module.

* * * * *